United States Patent
Koh et al.

(10) Patent No.: US 11,574,985 B2
(45) Date of Patent: Feb. 7, 2023

(54) ORGANIC LIGHT-EMITTING DIODE DISPLAY DEVICE AND METHOD OF MANUFACTURING SAME

(71) Applicant: LG Display Co., Ltd., Seoul (KR)

(72) Inventors: Youngju Koh, Paju-si (KR); Woojung Byun, Paju-si (KR); Dongyoon Lee, Paju-si (KR); Sungsoo Kim, Paju-si (KR); Kwangyong Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 133 days.

(21) Appl. No.: 17/135,475

(22) Filed: Dec. 28, 2020

(65) Prior Publication Data
US 2021/0202670 A1 Jul. 1, 2021

(30) Foreign Application Priority Data
Dec. 31, 2019 (KR) .................. 10-2019-0180134

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 51/5237* (2013.01); *H01L 51/56* (2013.01); *H01L 2227/323* (2013.01)

(58) Field of Classification Search
CPC ................................................ H01L 27/3276
See application file for complete search history.

(56) References Cited

U.S. PATENT DOCUMENTS

| | | | |
|---|---|---|---|
| 9,391,212 B2 | 7/2016 | Choi | |
| 10,177,206 B2 * | 1/2019 | Jung | ............ H01L 51/5228 |
| 2014/0103317 A1 | 4/2014 | Choi | |
| 2016/0149155 A1 * | 5/2016 | Kim | ............ H01L 27/3279 |
| | | | 438/23 |
| 2018/0006098 A1 * | 1/2018 | Hong | ............ H01L 27/3262 |

(Continued)

FOREIGN PATENT DOCUMENTS

| | | |
|---|---|---|
| TW | 201417268 A | 5/2014 |
| TW | 201739081 A | 11/2017 |

OTHER PUBLICATIONS

Taiwan Intellectual Property Office, Office Action, TW Patent Application No. 109146895, dated Jul. 30, 2021, 23 pages.

(Continued)

*Primary Examiner* — Douglas M Menz
(74) *Attorney, Agent, or Firm* — Fenwick & West LLP

(57) ABSTRACT

Provided is an organic light-emitting diode (OLED) display device. The OLED display device includes a substrate in which a pixel area and a non-pixel area are defined, a power line formed on the substrate, at least one insulating film covering the power line, a light-emitting element formed on the insulating film, a connection electrode connected to the power line and formed to extend along an upper surface of the insulating film, and a passivation film having a contact hole through which a portion of the connection electrode is exposed within the non-pixel area. The light-emitting element includes a first electrode, an emissive layer, and a second electrode that are sequentially stacked. The second electrode is in direct contact with the connection electrode within the contact hole.

12 Claims, 9 Drawing Sheets

(56) References Cited

U.S. PATENT DOCUMENTS

| | | |
|---|---|---|
| 2018/0123078 A1 | 5/2018 | Byun et al. |
| 2018/0151831 A1 | 5/2018 | Lee et al. |
| 2019/0189717 A1 | 6/2019 | Choi et al. |
| 2019/0207168 A1 | 7/2019 | Lee et al. |
| 2019/0326370 A1 | 10/2019 | Lu |

OTHER PUBLICATIONS

European Patent Office, Extended European Search Report and Opinion, EP Patent Application No. 20216754.0, dated Jun. 8, 2021, ten pages.

* cited by examiner

ORGANIC LIGHT-EMITTING DIODE DISPLAY DEVICE AND METHOD OF MANUFACTURING SAME

CROSS REFERENCE TO RELATED APPLICATIONS

The present application claims priority to Republic of Korea Patent Application No. 10-2019-0180134, filed on Dec. 31, 2019, the entire contents of which is incorporated herein for all purposes by this reference.

BACKGROUND

1. Field

The present invention relates to an organic light-emitting diode (OLED) display device and a method of manufacturing the same.

2. Description of the Related Art

With the advance of information society, various types of display devices have been developed. Recently, various display devices such as a liquid crystal display (LCD), a plasma display panel (PDP), and an organic light-emitting display (OLED) have been used.

Since an organic light-emitting element constituting an organic light-emitting display device is a self-emissive element, such an organic light-emitting display device does not require an additional light source, resulting in implementation of a thin and lightweight display device. In addition, such an organic light-emitting diode (OLED) display device exhibits high-quality characteristics such as low power consumption, high brightness, and fast reaction speed.

An OLED display device includes an array of pixels each including a transistor, a capacitor, and a light-emitting element. As the resolution and size of a display device increase, the number and density of pixels arranged in the display device correspondingly increase. In order to ensure the operation and performance reliability of such a larger high-density display device, it is necessary to reduce the complexity of manufacturing processes and to improve a production yield.

SUMMARY

In particular, an organic light-emitting diode (OLED) display device has an undercut structure inside a contact hole through which one electrode is connected to another electrode. In this case, it is required to prevent defects attributable to short-circuiting of interconnection lines after forming the undercut structure and to optimize manufacturing processes for production efficiency of OLED display devices.

The present disclosure has been made in view of the problems occurring in the related art and one objective of the present invention is to provide an OLED display device having a simplified undercut structure.

Another objective of the present disclosure is to provide a method of manufacturing an OLED display device having a simplified undercut structure.

Objectives of the present disclosure are not limited to the objectives mentioned above, and other objectives and advantages not mentioned above will be clearly understood by those skilled in the art from the following description.

In order to accomplish one of the objectives of the present invention, an organic light-emitting diode (OLED) display device according to some exemplary embodiments of the present disclosure includes a substrate in which a pixel area and a non-pixel area are defined, an auxiliary electrode formed on the substrate, a buffer film covering the auxiliary electrode, an active interconnection line formed on the buffer film, an auxiliary interconnection line extending through the buffer film and connecting one end of the active interconnection line and the auxiliary electrode through the buffer film, a first passivation film covering the auxiliary interconnection line and having a contact hole in which an undercut structure is provided, and a light-emitting element including a first electrode, an emissive layer, and a second electrode that are sequentially stacked on the first passivation film within the pixel area, in which the second electrode extends into the non-pixel area so as to be directly connected to the active interconnection line exposed through the undercut structure.

In some embodiments of the present disclosure, the second electrode may extend along the upper surface of the active interconnection line and extend into the undercut structure so as to be connected to the auxiliary interconnection line.

In some embodiments of the present disclosure, a portion of the first passivation film projects out over the active interconnection line, and the emissive layer may not be formed on an upper surface of the active interconnection line that overlaps the first passivation film.

In some embodiments of the present disclosure, the OLED display device may further include a driving transistor formed on the substrate and driving the light-emitting element, in which the driving transistor includes a gate electrode and a drain electrode electrically connected to the first electrode, and the gate electrode, the drain electrode, and the auxiliary interconnection line may be formed in the same process step.

In some embodiments of the present disclosure, the OLED display device may further include an auxiliary substrate provided with a color filter and bonded to the substrate by a filler material disposed between the auxiliary substrate and the substrate.

In some embodiments of the present disclosure, an upper end of the undercut structure may be defined by a lower surface of the first passivation film.

In some embodiments of the present disclosure, a portion of the first passivation film may protrude into the contact hole so as to project over and overlap the active interconnection line when viewed from above, and the second electrode may extend to an upper surface of the active interconnection line overlapping the first passivation film.

In some embodiments of the present disclosure, the OLED display device may further include a second passivation film provided to fill the undercut structure.

In order to accomplish another objective of the present invention, a method of manufacturing an organic light-emitting diode (OLED) display device, according to some exemplary embodiments of the present disclosure, includes forming an auxiliary electrode on a substrate in which a pixel area and a non-pixel area are defined, forming a buffer film in a manner to cover the auxiliary electrode, forming an active interconnection line on the buffer film, forming an auxiliary interconnection line passing through the buffer film and connecting at least one of the auxiliary electrodes to the active interconnection line, forming a passivation film covering the auxiliary interconnection line; exposing a portion of the auxiliary interconnection line by etching the passivation film in the non-pixel area, forming a contact hole including an undercut structure by partially etching a portion of the exposed auxiliary interconnection line, and forming a light-emitting element including a first electrode, an emissive layer, and a second electrode that are sequentially formed on the passivation film, in which the second electrode extends into the non-pixel area so as to be in contact with the active interconnection line exposed through the undercut structure.

In some embodiments of the present disclosure, the forming of the active interconnection line may include forming an active pattern including a silicon-based semiconductor or an oxide semiconductor on the buffer film; and performing at least one of plasma treatment and heat treatment on the active pattern to change the active pattern to be conductive.

In some embodiments of the present disclosure, in the method, the second electrode is formed to extend along the upper surface of the active interconnection line and into the undercut structure so that the second electrode is connected with the auxiliary interconnection line within the undercut structure.

In some embodiments of the present disclosure, the method may further include forming a driving transistor that drives the light-emitting element, on the substrate, in which the driving transistor includes a gate electrode and a drain electrode electrically connected to the first electrode. In addition, the gate electrode, the drain electrode and the auxiliary interconnection line may be formed in the same process step.

In some embodiments of the present disclosure, the method may further include bonding the auxiliary substrate provided with a color filter to the substrate, the color filter being disposed to face the substrate.

The organic light-emitting diode (OLED) display device according to the embodiments of the present disclosure has an advantage of a low contact resistance because the second electrode of the light-emitting element and the active interconnection line are directly connected to each other. This reduces power consumption and heat generation.

In addition, since the second electrode is in direct contact with the auxiliary interconnection line within the undercut structure, the area of the contact surface on which a conductive path between the second electrode and the auxiliary electrode can be formed increases. Therefore, it is possible to reduce the power consumption of the OLED display device.

The effects of the present disclosure are not limited to the effects mentioned above, and other effects not mentioned will become apparent to those skilled in the art from the description of the claims.

DETAILED DESCRIPTION OF THE EMBODIMENTS

Figure 1:
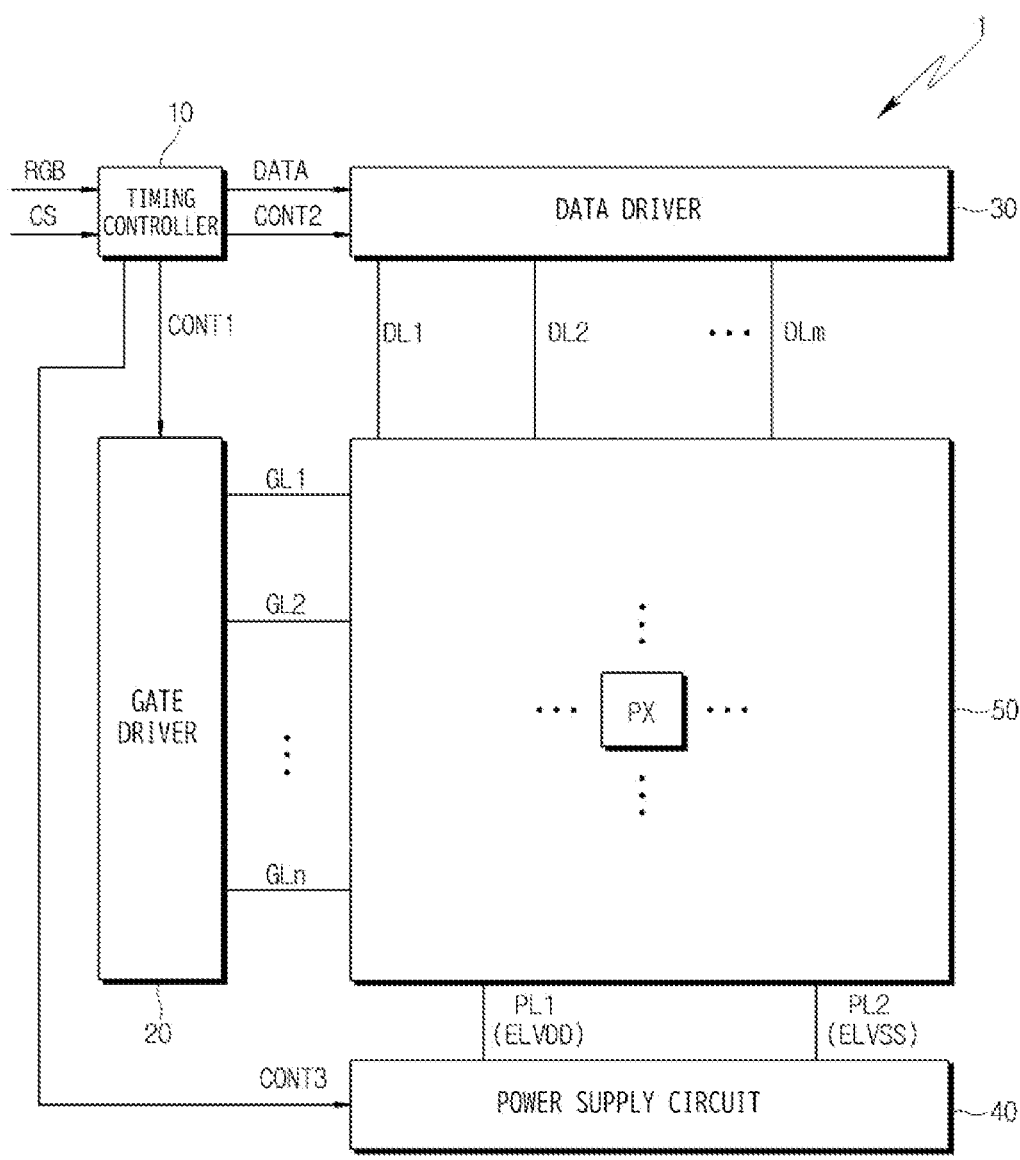
FIG. 1 is a block diagram illustrating the construction of a display device according to one exemplary embodiment of the present disclosure.

Hereinafter, various exemplary embodiments will be described with reference to the accompanying drawings. Throughout the description, when a component is described as being "disposed on", "connected to", "coupled to", or "combined with" another component, it should be understood that the component may be disposed on, connected to, coupled to, or combined with another component directly or with another component interposing therebetween.

Throughout the drawings, the same reference character refers to the same constituent element. In addition, the thickness, proportion, and dimensions of each of the constituent elements that are illustrated in the drawings are exaggerated for effective description and illustration. The expression "and/or" includes all combinations of one or more associated elements.

Although used to describe various constituent elements, the terms first, second, and so on do not impose any limitation on the terms. The terms are used to distinguish one constituent component from one or more other constituent components. Therefore, a first constituent element that will be described below may be a second constituent element that falls within the scope of the technological idea of the present invention. As used herein, the singular forms "a", "an", and "the" are intended to include the plural forms as well, unless the context clearly indicates otherwise.

When the terms "above", "over", "below", "under", "underneath", "adjacent to", and the like are used to describe a positional relationship between two constituent elements, one or more other constituent elements may be positioned between the two constituent elements. Those terms are determined relatively among constituent elements on the basis of the directions indicated in the drawings.

It will be further understood that the terms "comprises" and/or "comprising," or "includes" and/or "including," or "has" and/or "having" when used in this specification, specify the presence of stated features, regions, integers, steps, operations, elements and/or components, but do not preclude the presence or addition of one or more other features, regions, integers, steps, operations, elements, components and/or groups thereof.

FIG. 1 is a block diagram illustrating the construction of a display device according to an exemplary embodiment of the present disclosure.

Referring to FIG. 1, a display device 1 includes a timing controller 10, a gate driver 20, a data driver 30, a power supply unit 40, and a display panel 50.

The timing controller 10 may receive an image signal RGB and a control signal CS from an external device. The image signal RGB may be grayscale data composed of multiple grayscale levels. The control signal CS may include, for example, a horizontal synchronization signal, a vertical synchronization signal, and a main clock signal.

The timing controller 10 processes the image signal RGB and the control signal CS to be suitable for the operating conditions of the display panel 50, thereby generating and outputting image data, a gate driving control signal CONT1, and a data driving control signal CONT2, and a power supply control signal CONT3.

The gate driver 20 may be connected to the pixels PX of the display panel 50 through a plurality of gate lines GL1 to GLn. The gate driver 20 may generate gate signals from the gate drive control signal CONT1 output from the timing controller 10. The gate driver 20 may provide the generated gate signals to the pixels PX through the plurality of gate lines GL1 to GLn.

The data driver 30 may be connected to the pixels PX of the display panel 50 through a plurality of data lines DL1 to DLm. The data driver 30 may generate data signals from the image data DATA and the data driving control signal CONT2 output from the timing controller 10. The data driver 30 may provide the generated data signals to the pixels PX through the plurality of data lines DL1 to DLm.

The power supply unit 40 may be connected to the pixels PX of the display panel 50 through a plurality of power lines PL1 and PL2. The power supply unit 40 may generate driving voltages to be supplied to the display panel 50 on the basis of the power supply control signal CONT3. The driving voltages may include, for example, a high-potential driving voltage ELVDD and a low-potential driving voltage ELVSS. The power supply unit 40 may supply the generated driving voltages ELVDD and ELVSS to the pixels PX through the corresponding power lines PL1 and PL2.

The multiple pixels (or called sub-pixels) PX are arrayed on the display panel 50. The pixels PX may be arranged in a matrix form on the display panel 50.

Each of the pixels PX is electrically connected to a corresponding one of the gate lines and a corresponding one of the data lines. The pixels PX emit light with brightness levels corresponding to the gate signals and the data signals supplied through the gate lines GL1 to GLn and the data lines DL1 to DLm.

Each of the pixels PX shine may display one of three colors which are referred to as a first color, a second color, and a third color, respectively. According to one embodiment, each of the pixels PX displays any one of red, green, and blue colors. According to another embodiment, each of the pixels PX displays any one color of cyan, magenta, and yellow. In various embodiments, each of the pixels PXs is configured to display any one of four or more colors. For example, each of the pixels PX may display any one of red, green, blue, and white colors.

The timing controller 10, the gate driver 20, the data driver 30, and the power supply unit 40 may be implemented as separate integrated circuits (ICs), respectively. Alternatively, two or more components of the timing controller 10, the gate driver 20, the data driver 30, and the power supply unit 40 may be integrated into a single integrated circuit (IC). For example, the timing controller 10 and at least one of the data driver 30 and the power supply unit 40 may be combined into a single integrated circuit.

In FIG. 1, the gate driver 20 and the data driver 30 are illustrated as separate components from the display panel 50. However, it is possible that the display panel and at least one of the gate driver 20 and the data driver 30 are integrated into a single unit which is called in-panel type. For example, in the case of a gate-in-panel (GIP) scheme, the gate driver 20 is integrated into the display panel 50.

Figure 2:
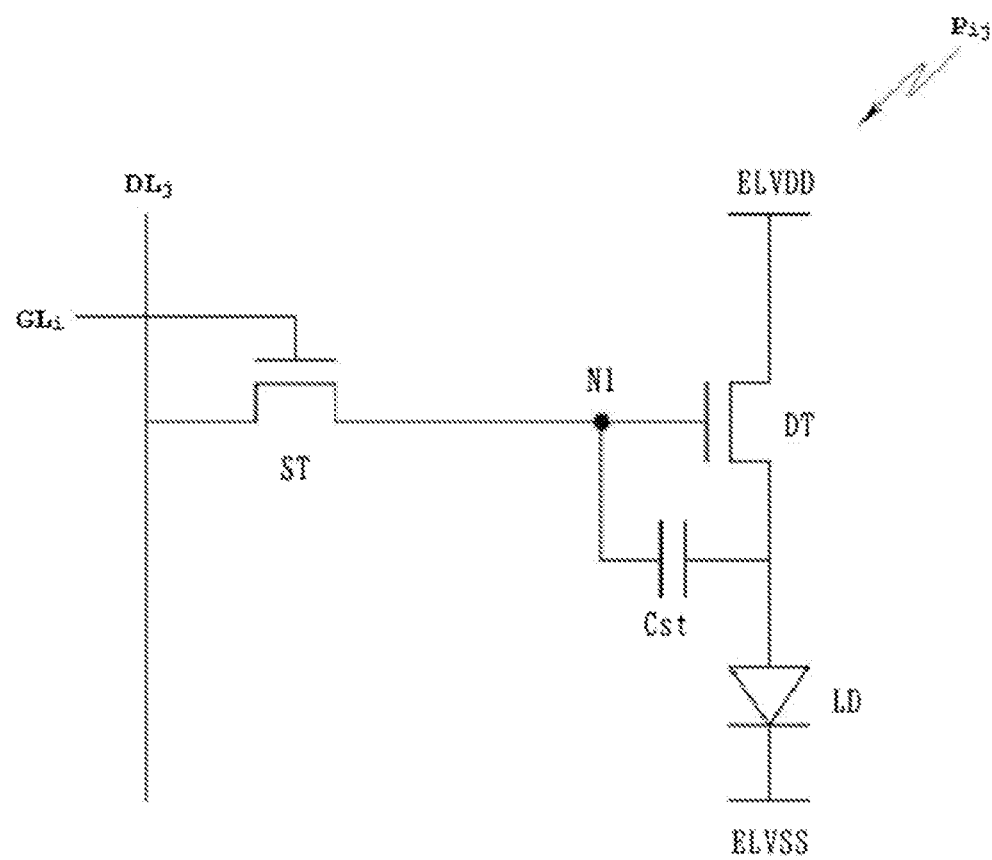
FIG. 2 is a circuitry diagram illustrating a pixel of the display device of FIG. 1.

FIG. 2 is a circuitry diagram illustrating a pixel of FIG. 1. For example, FIG. 2 illustrates a pixel PXij connected to an i-th gate line GLi and a j-th data line DLj.

Referring to FIG. 2, a pixel PX includes a switching transistor ST, a driving transistor DT, a storage capacitor Cst, and a light-emitting element LD.

A first electrode (for example, source electrode) of the switching transistor ST is electrically connected to the j-th data line DLj, and a second electrode (for example, drain electrode) is electrically connected to a first node Nl. The gate electrode of the switching transistor ST is electrically connected to the i-th gate line GLi. The switching transistor ST is turned on when a gate signal having a gate-on level is applied to the i-th gate line GLi, thereby transferring a data signal supplied through the j-th data line DLj to the first node Nl.

A first electrode of the storage capacitor Cst is electrically connected to the first node N1, and a second electrode of the storage capacitor Cst is electrically connected to the anode electrode of the light-emitting element LD. The driving transistor DT operates to allow a driving current to flow between a voltage terminal for supplying the high-potential driving voltage ELVDD and a voltage terminal for supplying the low-potential driving voltage ELVSS, according to the data voltage stored in the storage capacitor Cst.

The first electrode (for example, the source electrode) of the driving transistor DT is configured to receive the high-potential driving voltage ELVDD, and the second electrode (for example, the drain electrode) is electrically connected to the first electrode (for example, anode electrode) of the light-emitting element LD. The gate electrode of the driving transistor DT is electrically connected to the first node Nl. The driving transistor DT is turned on when a voltage corresponding to the gate-on level is applied to the gate electrode thereof through the first node N1 and controls the amount of a driving current flowing through the light-emitting element LD according to the voltage applied to the gate electrode thereof.

The light-emitting element LD emits an amount of light corresponding to the driving current. The light-emitting element LD may emit light of any one color selected from among red, green, and blue colors. The light-emitting element LD may be an organic light-emitting diode (OLED), or an ultra-small inorganic light-emitting diode having a size ranging from a microscale to a nanoscale, but the present invention is not limited thereto. Hereinafter, an embodiment in which the light-emitting element LD is implemented with an organic light-emitting diode will be described.

In various embodiments of the present disclosure, the structure of the pixels PX is not limited to that illustrated in FIG. 2. According to one embodiment, each of the pixels PX may include at least one element selected from among an element for compensating for a change in the threshold voltage of the driving transistor DT and an element for initializing the voltage of the gate electrode of the driving transistor DT and/or the voltage of the anode electrode of the light-emitting element LD.

FIG. 2 illustrates an example in which the switching transistor ST and the driving transistor DT are NMOS transistors, but the present disclosure is not limited thereto. For example, at least some or all of the transistors constituting each pixel PX may be implemented with PMOS transistors. In various embodiments, each of the switching transistor ST and the driving transistor DT may be implemented with a low-temperature polysilicon (LIPS) thin film transistor (TFT), an oxide thin film transistor, or a low-temperature polycrystalline oxide (LTPO) thin film transistor (TFT).

Figure 3:
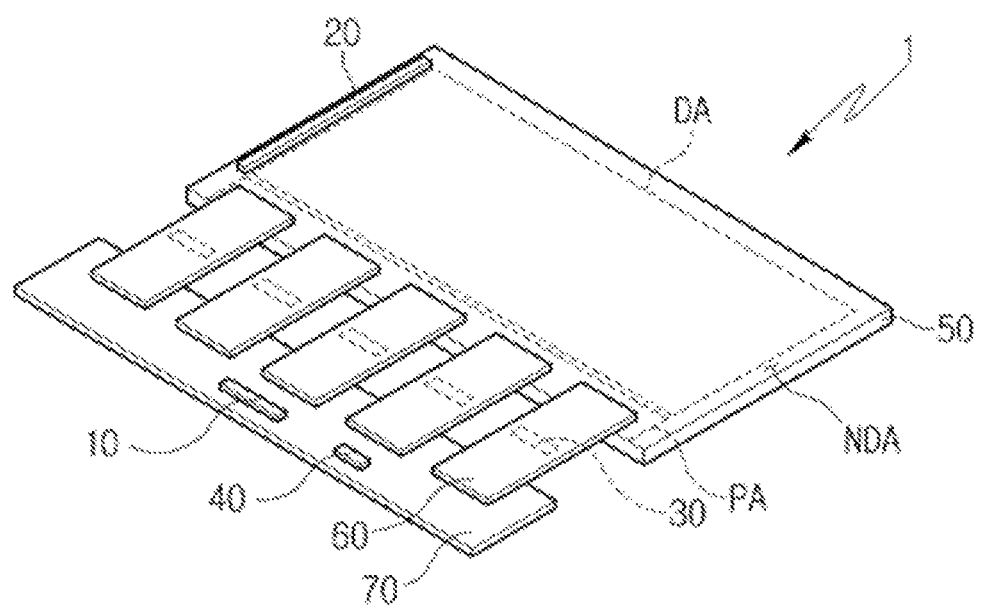
FIG. 3 is a perspective view of the display device of FIG. 1 according to one embodiment of the present disclosure.

FIG. 3 is a perspective view of the display device of FIG. 1 according to one embodiment of the present disclosure. Components of the display device 1 will be described in more detail with reference to FIGS. 1, 2, and 3.

The display device 1 is a device for displaying an image. The display device 1 may be a self-emissive display such as an organic light-emitting diode display or a non-emissive display such as a liquid crystal display (LCD), an electrophoretic display (EPD), and an electro-wetting display (EWD).

The display device 1 can be implemented in a variety of forms. For example, the display device 1 may take a rectangular plate shape. However, the present disclosure is not limited thereto. For example, the display device 1 may have a square shape, a circular shape, an elliptical shape, or a polygonal shape. The display device 1 may have a corner-rounded shape or a corner-chamfered shape. The display device may be shaped such that the thickness of at least part thereof changes gradually. Alternatively, at least a portion of the display device 1 may be flexible.

The display panel 50 includes a display area DA and a non-display area NDA. The display area DA is an area within which the pixels PX are disposed. The display area DA is also referred to as an active area. The non-display area NDA may be disposed at the periphery of the display area DA. For example, the non-display area NDA may be disposed along the periphery of the display area DA. The term "non-display area NDA" collectively refers to areas other than the display area DA within the display panel 50 and can be referred to as a non-active area.

The non-display area NDA is provided with the gate driver 20 to drive the pixels PX. The gate driver 20 may be disposed adjacent to one side or two opposite sides of the display area DA while being disposed within the non-display area NDA. The gate driver 20 may be provided within the non-display area NDA of the display panel 50 in a gate-in-panel manner, as illustrated in FIG. 3. However, in another embodiment, the gate driver 20 may be implemented as a driving chip, mounted on a flexible film or the like, and bonded to the non-display area NDA using a tape automated bonding (TAB) method.

The non-display area NDA may be provided with a plurality of pads (not shown). The pads are not covered with an insulating layer. That is, the pads are exposed from the surface of the display panel 50 and electrically connected to the data driver 30 and a circuit board 70 which will be described later.

The display panel 50 may include interconnection lines through which electrical signals are transferred to the pixels PX. The interconnection lines may include, for example, gate lines GL1 to GLn, data lines DL1 to DLm, and power lines PL1 and PL2.

The power lines PL1 and PL2 are electrically connected to the power supply unit 40 (or the timing controller 10) through the pads, thereby transferring a high-potential driving voltage ELVDD and a low-potential driving voltage ELVSS supplied from the power supply unit 40 (or the timing controller 10) to the pixels The driving power and the low potential driving power may be provided to the pixels PX.

A flexible film 60 has a first end attached to a pad area PA of the display panel 50 and a second end attached to a circuit board 70. The flexible film 60 electrically connects the display panel 50 and the circuit board 70. The flexible film 60 includes a plurality of interconnection lines for electrically connecting the pads formed in the pad area PA to the interconnection lines of the circuit board 70. According to one embodiment, the flexible film 60 is attached to the upper surfaces of the respective pads via an anisotropic conducting film (ACF).

When the data driver 30 is manufactured as a driver chip, the data driver 30 may be mounted on the flexible film 60 in a chip-on-film (COF) or chip-on-plastic (COP) manner. The data driver 30 generates data signals on the basis of the image data DATA and the data driving control signal CONT2 received from the timing controller 10 and outputs the data signals to the data lines DL1 to DLm through the connected pads.

A number of circuits, each being implemented in the form of a driver chip, may be mounted on the circuit board 70. The circuit board 70 may be a printed circuit board or a flexible printed circuit board, but the type of the circuit board 70 is not limited thereto.

The circuit board 70 may include the timing controller 10 and the power supply unit 40 each of which is mounted in the form of an integrated circuit. In FIG. 3, the timing controller 10 and the power supply unit 40 are illustrated as separate components, but the present embodiment is not limited thereto. That is, in various embodiments, the power supply unit 40 and the timing controller 10 may be integrated. Alternatively, the timing controller 10 may be configured to perform the function of the power supply unit 40.

Figure 4:
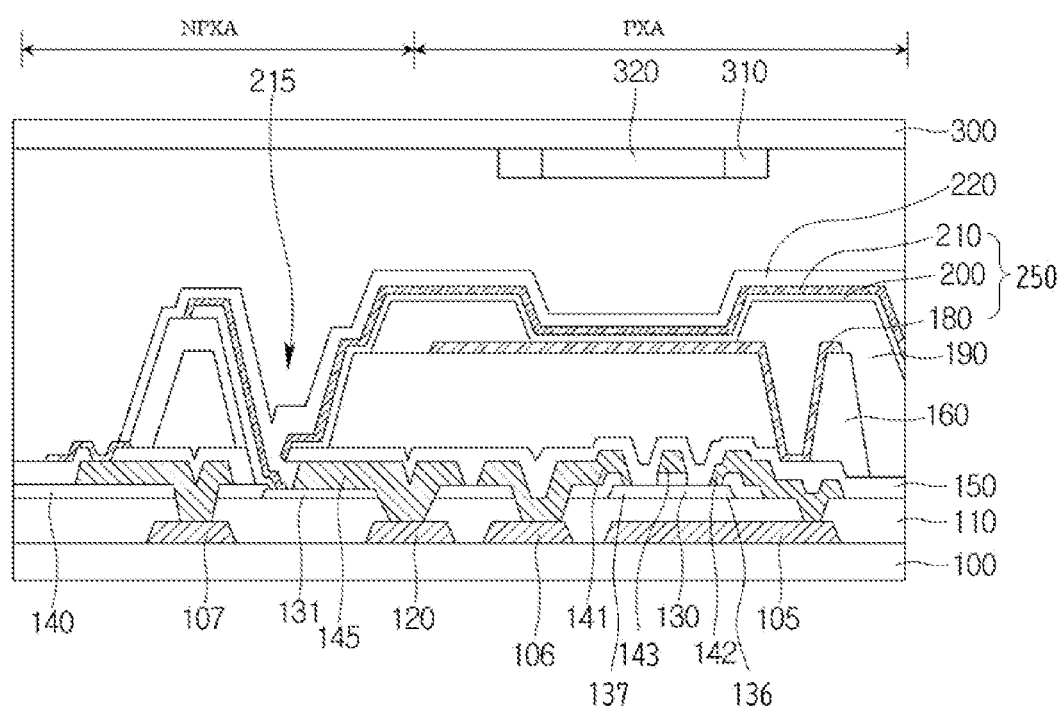
FIG. 4 is a cross-sectional view of a display panel of the display device according to one embodiment of the present disclosure.

FIG. 4 is a cross-sectional view of a display panel according to one exemplary embodiment of the present disclosure.

Referring to FIG. 4, the display panel 50 includes a pixel area PXA within which a pixel PX composed of circuit elements and a light-emitting element 250 is formed and a non-pixel area NPXA disposed around the pixel area PXA. The non-pixel area NPXA may include a non-display area NDA and/or a boundary between adjacent pixels PX.

As illustrated in FIG. 4, the display panel 50 according to one exemplary embodiment of the present disclosure may include top emission-type light-emitting elements 250. When the light-emitting elements 250 are top emission-type elements, light emitted from an organic emissive layer exits the light-emitting elements 250 through the cathode electrodes formed on the top surface. The emitted light is selectively transmitted through a color filter 320. That is, only specific wavelengths pass through the color filter 320. The color filter 320 is an optional component and thus can be omitted.

The display panel 50 includes a first substrate 100, a buffer film 110, an auxiliary electrode 120, an auxiliary interconnection line 145, a first passivation film 150, an overcoat film 160, and a light-emitting element 250, and a contact hole 215.

The first substrate 100 is a base substrate of the display panel 50, and it may be a light-transmitting substrate (i.e., transparent substrate). The first substrate 100 may be a rigid substrate made of glass or tempered glass or may be a flexible substrate made of plastic. For example, the first substrate 100 is made of a plastic material such as polyimide (PI), polyethylene terephthalate (PET), polyethylene naphthalate (PEN), polycarbonate (PC), etc. However, the material of the first substrate 100 is not limited thereto.

Auxiliary electrodes 105, 106, 107, and 120 may be disposed on the first substrate 100. The auxiliary electrode 105 that is disposed below the active pattern 130 functions as a light blocking layer, thereby protecting oxide semiconductor devices from external light. That is, the auxiliary electrode and the active pattern 130 are disposed at different heights to overlap each other.

At least one of the auxiliary electrodes 105, 106, 107, and 120 is connected to the first power line PL1 to which the high-potential driving voltage ELVDD is applied or the second power line PL2 to which the low-potential driving voltage ELVSS is applied. However, the present disclosure is not limited thereto. Specifically, the auxiliary electrode 120 connected to the auxiliary interconnection line 145 may be connected to the second power line PL2 to which the low-potential driving voltage ELVSS is applied. In addition, another auxiliary electrode (not illustrated) adjacent to the auxiliary electrode 120 is also connected to the second power line PL2 to which the low potential driving voltage ELVSS is applied. That is, there may be two paths to which the low-potential driving voltage ELVSS is applied. With this configuration, it is possible to obtain an effect of reducing interconnection line resistance.

The auxiliary electrodes 105, 106, 107, and 120 are made of a metal or a metal alloy selected from a group consisting of molybdenum (Mo), aluminum (Al), chromium (Cr), gold (Au), titanium (Ti), nickel (Ni), neodymium (Nd), copper (Cu), and alloys of those metals.

The buffer film 110 is formed on the first substrate 100 in a manner to cover the auxiliary electrodes 105, 106, 107, and 120. The buffer film 110 prevents diffusion of ions or impurities from the first substrate 100 and blocks moisture. In addition, the buffer film 110 improves the surface evenness of the first substrate 100.

The buffer film 110 is made of an inorganic material such as an oxide or a nitride, an organic material, or an organic-inorganic composite. The buffer film 110 may have a single layer structure or a multi-layer structure. For example, the buffer film 110 may be a multi-layer structure composed of three or more layers. For example, the buffer film 110 is a stack of a silicon oxide layer, a silicon nitride layer, and a silicon oxide layer.

The active pattern 130 is formed on the buffer film 110. The active pattern 130 is made of a silicon-based semiconductor material or an oxide-based semiconductor material. Amorphous silicon or polycrystalline silicon may be used as the silicon-based semiconductor material. As the oxide-based semiconductor material, a quaternary metal oxide such as indium tin gallium zinc oxide (InSnGaZnO), a ternary metal oxide such as indium gallium zinc oxide (InGaZnO), indium tin zinc oxide (InSnZnO), indium aluminum zinc oxide (InAlZnO), tin gallium zinc oxide (SnGaZnO), aluminum gallium zinc oxide (AlGaZnO), tin aluminum zinc oxide (SnAlZnO), or a binary metal oxide such as indium zinc oxide (InZnO), tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), indium oxide (InO), tin oxide (SnO), and zinc oxide (ZnO) is used.

The active pattern 130 may include a drain region 136 and a source region 137 containing p-type or n-type impurities. A channel may be formed between the drain region 136 and the source region 137.

The active interconnection line 131 is formed on the buffer film 110. As described later, the active interconnection line 131 may electrically connect the second electrode 210 and the auxiliary interconnection line 145.

The active interconnection line 131 may be a conductive line made of a silicon-based semiconductor or oxide-based semiconductor. For example, the oxide-based semiconductor formed on the buffer film 110 can be changed to be a conductor through a plasma etching process or an enhanced capacitively coupled plasma treatment process. However, the method of changing an oxide semiconductor into a conductor is not limited thereto. An oxide semiconductor can be changed into a conductor through heat treatment. In some embodiments, the active interconnection line 131 may be formed on the buffer film 110 through the same process as a method of forming the active pattern 130 before performing the plasma treatment.

The gate insulating film 140 is interposed between the gate electrode 143 to be described later and the active pattern 130. The gate insulating film 140 may be formed to cover the buffer film 110.

The gate insulating film 140 is a silicon oxide (SiOx) film, a silicon nitride (SiNx) film, or a double film of SiOx and SiNx.

A first conductive film is disposed on the gate insulating film 140. The first conductive film may include the gate electrode 143. The gate electrode 143 is disposed at a position corresponding to a channel between the drain region 136 and the source region 137 of the active pattern 130.

The gate electrode 143 is made of a material selected from the group consisting of molybdenum (Mo), aluminum (Al), chromium (Cr), gold (Au), titanium (Ti), nickel (Ni), neodymium (Nd), copper (Cu), and alloys of these metals. Alternatively, the gate electrode 143 may have a multi-layer structure made of one or more materials selected from the group consisting of molybdenum (Mo), aluminum (Al), chromium (Cr), gold (Au), titanium (Ti), nickel (Ni), neodymium (Nd), copper (Cu), and alloys of these metals. For example, the gate electrode 143 may be a double layer of molybdenum and aluminum-neodymium or a double layer of molybdenum and aluminum.

The first conductive film may further include an auxiliary interconnection line 145. The auxiliary interconnection line 145 is formed to extend through the gate insulating film 140 and the first buffer film 110 and is connected to the auxiliary electrode 120. The auxiliary interconnection line 145 extends to the non-pixel area NPXA, thereby being directly connected to the active interconnection line 131. Therefore, the first auxiliary interconnection line 145 forms an intermediate conductive path between the active interconnection line 131 and the auxiliary electrode 120.

The first auxiliary interconnection line 145 is formed in the same process step as the gate electrode 143. Here, the expression "one element is formed in the same process step as another element" means that one element and another element are formed simultaneously, i.e., through the same process. That is, the gate electrode 143 and the first auxiliary interconnection line 145 are simultaneously formed through the same process. The process may be a process of depositing a conductive material on the gate insulating film 140.

The first auxiliary interconnection line 145 and the active interconnection line 131 defines one side surface and the bottom surface of the contact hole 215, respectively, through which they can be electrically connected to the second electrode 210. In this regard, a more detailed description will be made with reference to FIGS. 5A and 5B.

Figure 5A:
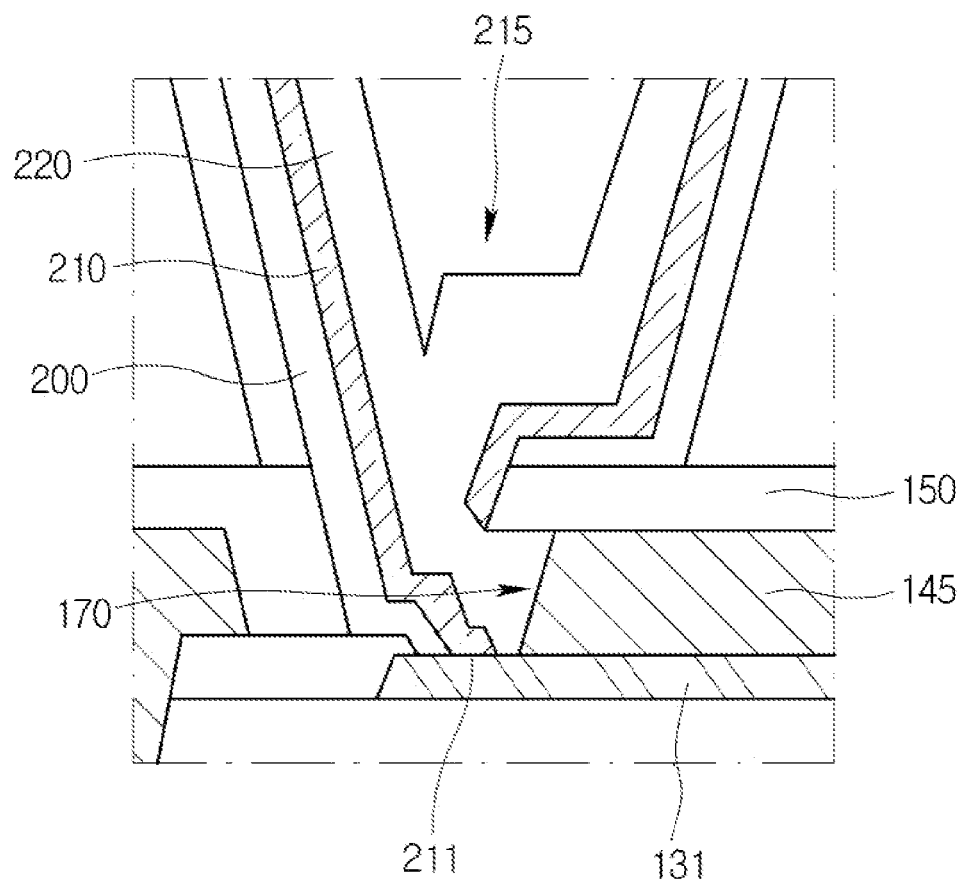
FIGS. 5A and 5B are enlarged views illustrating an undercut structure of FIG. 4 according to embodiments of the present disclosure.
Figure 5B:
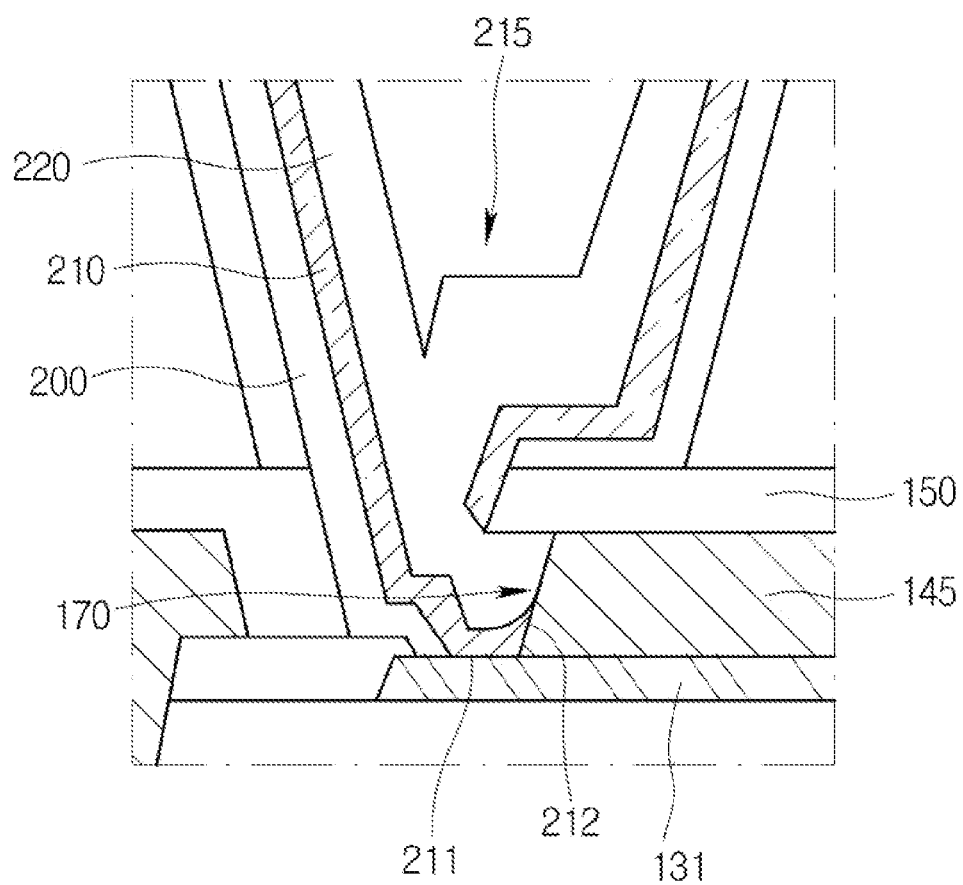

FIGS. 5A and 5B are enlarged views illustrating the contact hole 215 of FIG. 4 according to embodiments of the present disclosure.

Referring first to FIG. 5A, the contact hole 215 has an undercut structure 170 formed by etching the first auxiliary interconnection line 145 more than the first passivation film 150. The undercut structure 170 herein refers to a depression structure defined by the lower surface of the first passivation film 150, a side surface of the first auxiliary interconnection line 145, and the upper surface of the active interconnection line 131. The undercut structure 170 is introduced to make a contact between the second electrode 210 and the active interconnection line 131 or the first auxiliary interconnection line 145.

That is, since the first passivation film 150 is formed to project out over the bottom of the contact hole 215, the emissive layer 200 cannot be evenly formed on the surface of the contact hole 215 and is thus partially cut. When the second electrode 210 is formed on the emissive layer 200, the second electrode 210 and the active interconnection line 131 can be directly connected to each other. Since the second electrode 210 and the active interconnection line 131 are in direct contact with each other, the contact resistance in the contact hole 215 is reduced. This improves the characteristics of the OLED display in terms of power consumption and heat generation.

The contact surface 211 between the second electrode 210 and the active interconnection line 131 exists within the undercut structure 170. Therefore, the contact surface 211 may overlap the first passivation film 150 at least partially when viewed from above.

The remaining space in the contact hole 215 after the second electrode 210 is formed is filled with a second passivation film 220. Depending on the step coverage of the second passivation film 220, voids may be formed in the contact hole 215.

FIG. 5B illustrates a structure in which the second electrode 210 extends further into the undercut structure 170 than the second electrode 210 of the example of FIG. 5A, thereby being directly connected to the first auxiliary interconnection line 145.

Since the second electrode 210 is in direct contact with the first auxiliary interconnection line 145, the area of the contact surface 211 and 212 where a conduction path between the second electrode 210 and the auxiliary electrode 120 can be formed is increased. Therefore, this example further reduces the contact resistance in the contact hole 215 than the former example of FIG. 5A. That is, with this structure, the power consumption characteristic of the OLED display can be improved.

Referring to FIG. 5B, the undercut structure 170 is defined as a space defined by the lower surface of the first passivation film 150. With the structure of the undercut structure 170, when the second electrode 210 is deposited in a more amount than that in the example of FIG. 5B so that the second electrode 210 can be in contact with the lower surface of the first passivation film 150, a problem of a short circuit can be prevented. This can improve the operation reliability of the OLED display.

The first conductive film includes a source electrode 141 and a drain electrode 142. The source electrode 141 and the drain electrode 142 are disposed on the active pattern 130, with the gate electrode 143 therebetween, and spaced apart by a predetermined distance. The source electrode 141 and the drain electrode 142 are connected to the source region 137 and the drain region 136 of the active pattern 130, respectively.

The source electrode 141, the drain electrode 142, the gate electrode 143, and the first auxiliary interconnection line 145 are all included in the first conductive film. Therefore, the source electrode 141, the drain electrode 142, the gate electrode 143, and the first auxiliary interconnection line 145 are formed in the same process step. Therefore, the source electrode 141, the drain electrode 142, the gate electrode 143, and the first auxiliary interconnection line 145 can be formed using a single mask. This reduces process complexity.

The source electrode 141, the drain electrode 142, the gate electrode 143, and the active pattern 130 constitute a transistor. The transistor may be, for example, a driving transistor DT or a switching transistor ST. FIG. 4 illustrates an example in which the drain electrode 142 of the driving transistor DT is connected to the first electrode 180 of the light-emitting element 250.

The first conductive film further includes, for example, the lower electrodes of the storage capacitors Cst, electrodes of circuit elements such as the gate lines GL1 to GLn, and the driving lines.

The first passivation film 150 is formed on the first conductive film. The first passivation film 150 covers the source electrode 141, the drain electrode 142, the gate electrode 143, and the first auxiliary interconnection line 145 that are formed from the first conductive film. When the contact hole is formed to pass through the first passivation film 150, the undercut structure 170 through which at least a portion of the upper surface of the active interconnection line 131 is exposed is formed under the first passivation film 150.

The first passivation film 150 is an insulating film for protecting underlying elements thereof. The first passivation film 150 may be a single layer structure made of silicon oxide (SiOx) or silicon nitride (SiNx) or a multi-layer structure composed of a SiOx layer and a SiNx layer.

An overcoat film 160 is formed on the first passivation film 150. The overcoat film 160 is a planarization film (which is also referred to as step coverage film) for alleviating the steps formed in the underlying structure. The overcoat film 160 is made of an organic material such as polyimide, benzocyclobutene series resin, or acrylate.

The light-emitting elements 250 are formed on the overcoat film 160. Each of the light-emitting elements 250 includes a first electrode 180, an emissive layer 200, and a second electrode 210. The first electrode 180 may be an anode electrode, and the second electrode 210 may be a cathode electrode. When the light-emitting element 250 is a top emission type element as illustrated in FIG. 4, the first electrode 180 is a reflective electrode, and the second electrode 210 is a transmissive electrode.

The first electrode 180 is formed on the overcoat film 160. The first electrode 180 is connected to the drain electrode 142 of the transistor through a via hole passing through the overcoat film 155 and the first passivation film 150. The first electrode 180 is made of a transparent conductive material such as indium tin oxide (ITO), indium zinc oxide (IZO), or zinc oxide (ZnO). When the first electrode 180 is a reflective electrode, the first electrode 180 may include a reflective layer. The reflective layer is made of aluminum (Al), copper (Cu), silver (Ag), nickel (Ni), or any one of alloys thereof. In one embodiment, the reflective layer may be an APC structure which is a silver/palladium/copper alloy stack.

A bank insulating film 190 is formed on the overcoat film 155. The bank insulating film 190 is a pixel defining film that defines an emission region of a pixel PX. The bank insulating film 190 is formed to expose a portion (for example, center portion) of the first electrode 180 while covering the remaining portion (for example, periphery portion). It is preferable that the area of the exposed portion of the first electrode 180 is as large as possible in terms of ensuring a sufficient aperture ratio. The exposed portion of the first electrode 180, which is not covered by the bank insulating film 190, is the emission region of the pixel PX.

In the emission region, the first electrode 180, the emissive layer 200, and the second electrode 210 are stacked to be in direct contact with each other. The bank insulating film 190 is made of an organic material such as acrylic resin, epoxy resin, phenolic resin, polyamide resin, or polyimide resin.

The emissive layer 200 is formed on the first electrode 180 and the bank insulating film 190. The emissive layer 200 extends into the non-pixel area NPXA to fill a bottom portion of the contact hole 215 while partially exposing the top surface of the active interconnection line 131.

The emissive layer 200 has a multi-layer structure including a light generation layer. The emissive layer 200 includes a hole injection layer (HIL), a hole transport layer (HTL), an organic emissive layer, an electron injection layer (EIL), and an electron transport layer (ETL).

The emissive layer 200 may have a tandem structure composed of two or more stacks. In this case, each of the stacks includes a hole transport layer, an organic emissive layer, and an electron transport layer. When the emissive layer 200 has a tandem structure composed of two or more stacks, a charge generation layer is provided between each of the stacks. The charge generation layer includes an n-type charge generation layer positioned close to the underlying stack and a p-type charge generation layer formed on the n-type charge generation layer and positioned close to the overlying stack. The n-type charge generation layer injects electrons into the underlying stack, and the p-type charge generation layer injects holes into the overlying stack. The n-type charge generation layer may be a metal-doped organic layer prepared by doping an electron-transportable organic host material layer with an alkaline metal such as lithium (Li), sodium (Na), potassium (K), or cesium (Cs), or an alkaline earth metal such as magnesium (Mg), strontium (Sr), barium (Ba), or radium (Ra). The p-type charge generation layer may be a hole-transportable organic layer doped with a dopant.

The color of light generated by the light-emitting element 250 is red, green, or blue, but the present invention is not limited thereto. For example, the color of light generated by the light generation layer of the emissive layer 200 may be magenta, cyan, yellow, or white.

The second electrode 210 is formed on the emissive layer 200. The second electrode 210 is formed to cover the emissive layer 200. The second electrode 210 is formed to be in direct contact with the active interconnection line 131 or the auxiliary interconnection line 145 within the contact hole 215.

The second electrode 210 is made of a transparent conductive material (TOO). Alternatively, the second electrode 210 may be made of a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any alloy thereof. When the second electrode 210 is made of a semi-transmissive conductive material, light emission efficiency is increased by micro cavities.

A second passivation film 220 is formed to cover the light-emitting element 250. The second passivation film 220 prevents oxygen or moisture from permeating into the light-emitting element 250.

The second passivation film 220 is made of at least one of inorganic materials such as silicon nitride, aluminum nitride, zirconium nitride, titanium nitride, hafnium nitride, tantalum nitride, silicon oxide, aluminum oxide, and titanium oxide.

The second passivation film 220 extends into the non-pixel area NPXA to fill the contact hole 215.

A second substrate 300 is disposed to face the first substrate 100. The second substrate 300 is bonded to the first substrate 100 with a filling material. The second substrate 300 includes a transparent substrate made of a transparent material such as glass, plastic, or quartz to improve light transmittance.

A black matrix 310 is disposed on the second substrate 300. A color filter 320 is disposed between the block matrixes 310. The color filter 320 is disposed at a position corresponding to the light-emitting element 250. That is, the color filter 320 is disposed above the light-emitting element 250. When the emissive layer 200 can emit red, green, or blue light, the color filter CF can be omitted.

FIGS. 6 to 13 are diagrams illustrating intermediate steps of a manufacturing method of an organic light-emitting diode display according to one embodiment of the present disclosure.

Figure 6:
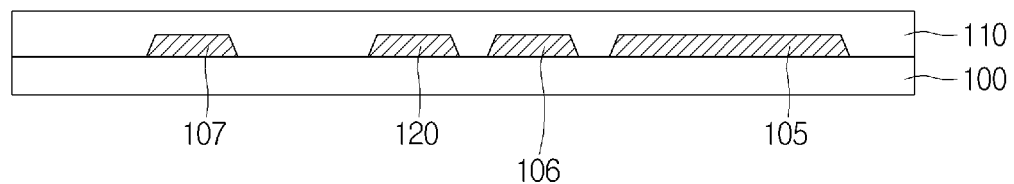
FIGS. 6 to 13 are diagrams illustrating intermediate manufacturing steps of a display device, according to one exemplary embodiment of the present disclosure.
Figure 7:
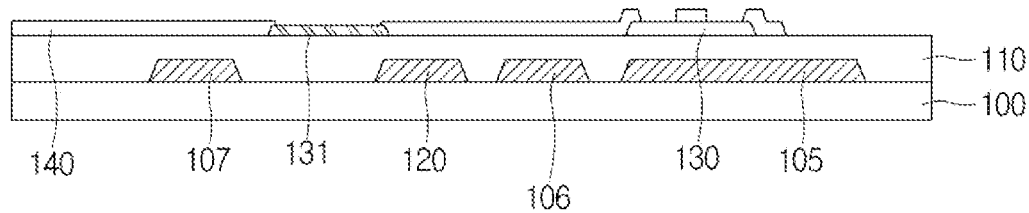

Referring to FIG. 6, auxiliary electrodes 105, 106, 107, and 120 are formed on a first substrate 100.

The auxiliary electrodes 105, 106, 107, and 120 are formed by depositing, on the first substrate 100, a conductive material such as molybdenum (Mo), aluminum (Al), chromium (Cr), gold (Au), titanium (Ti), nickel (Ni), neodymium (Nd), and copper (Cu).

A buffer film 110 is formed to cover the first substrate 100 and the auxiliary electrodes 105, 106, 107, and 120. The buffer film 110 includes an inorganic material (for example, an oxide or a nitride), an organic material, or an organic/inorganic composite. The buffer film 110 has a single layer structure or a multi-layer structure.

Figure 8:
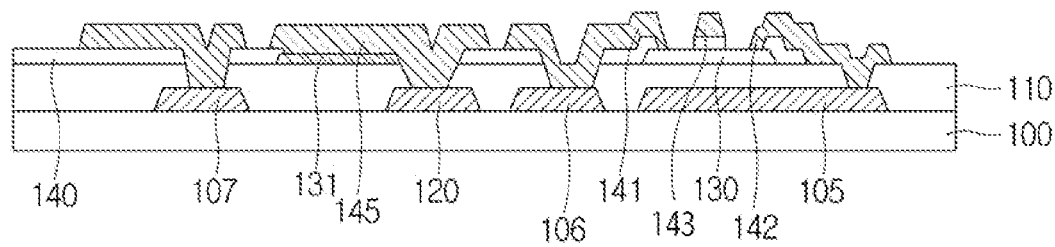

Referring to FIG. 8, an active pattern 130, an active interconnection line 131, and a gate insulating film 140 are formed on the buffer film 110.

The active pattern 130 is made of a silicon-based semiconductor material or an oxide-based semiconductor material. The active interconnection line 131 is formed by changing an oxide semiconductor into a conductor through a plasma treatment process or a heat treatment process on the active pattern.

The gate insulating film 140 is formed to cover at least a portion of the active pattern 130 and the active interconnection line 131.

Referring to FIG. 8, a first conductive film is formed on the gate insulating film 140, the active pattern 130, and the active interconnection line 131. The first conductive film includes a gate electrode 143, a source electrode 141, a drain electrode 142 and an auxiliary interconnection line 145. The first conductive film extends through the buffer film 110 and is connected to the auxiliary electrodes 105, 106, 107, and 120. As illustrated in FIG. 8, at an early stage at which the first conductive film is formed, the auxiliary interconnection line 145 entirely covers the active interconnection line 131.

Figure 9:
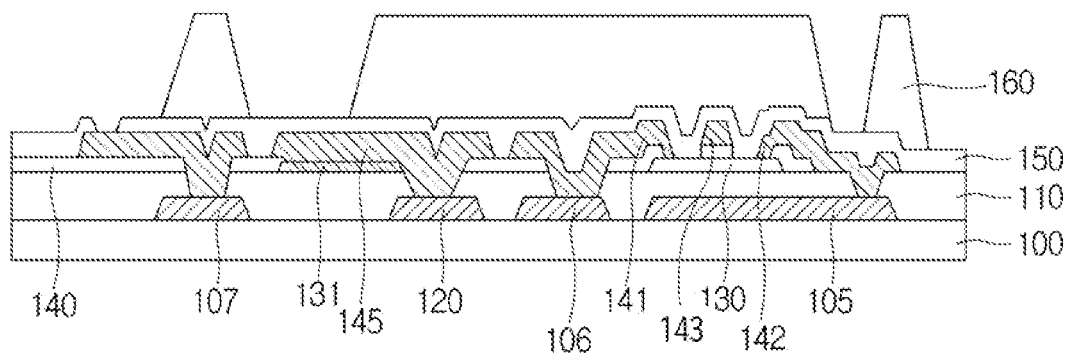

Referring to FIG. 9, a first passivation film 150 and an overcoat film 160 are formed on the first conductive film. The first passivation film 150 has a single layer structure or a multi-layer structure which is made of silicon oxide (SiOx), silicon nitride, or both. The overcoat film 160 contains an organic material such as is polyimide, benzocyclobutene series resin, and acrylate.

Figure 10:
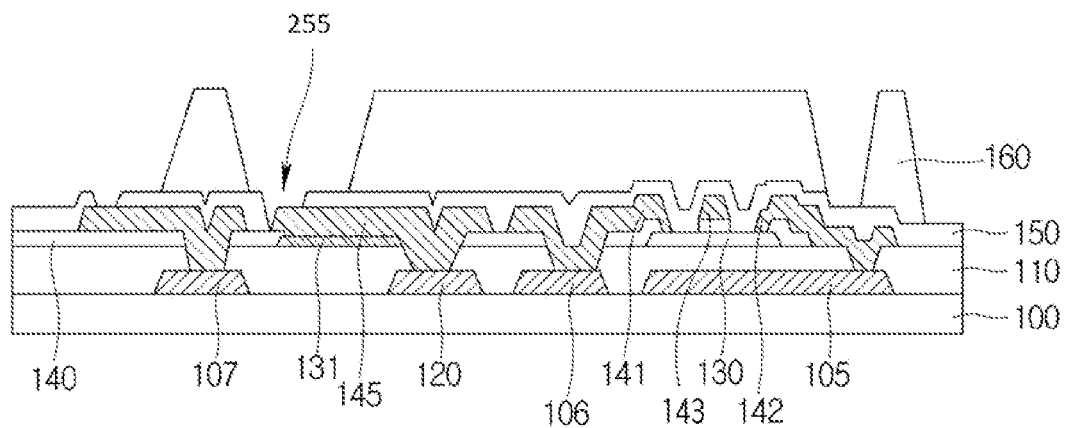

Referring to FIG. 10, the first passivation film 150 is partially removed to expose a portion of the first conductive film. When the first passivation film 150 is partially etched off, a pre-contact hole 255 is formed to expose a portion of the auxiliary interconnection line 145.

Figure 11:
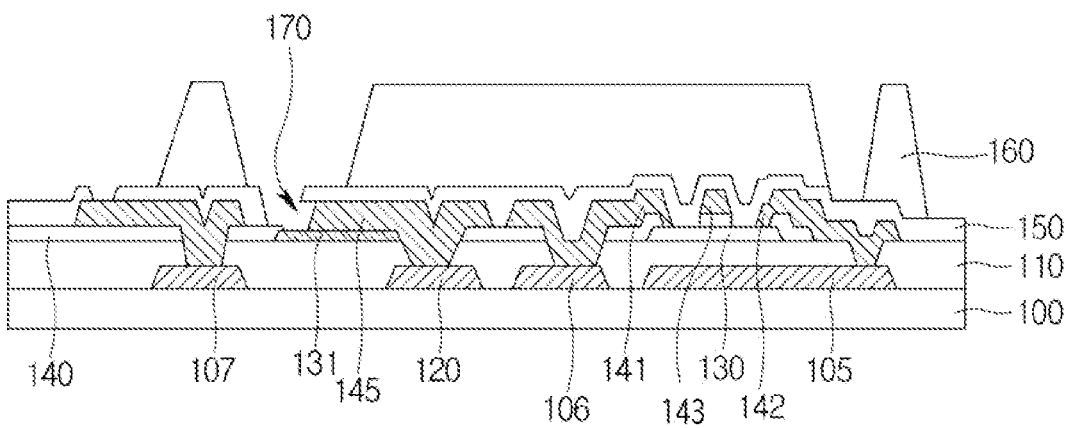

Referring to FIG. 11, the auxiliary interconnection line 145 exposed through the pre-contact hole 255 is selectively etched to form an undercut structure 170. The upper surface of the active interconnection line 131 is exposed through the undercut structure 170. Since the undercut structure 170 is formed, a portion of the first passivation film 150 projects out over the upper surface of the active interconnection line 131.

Figure 12:
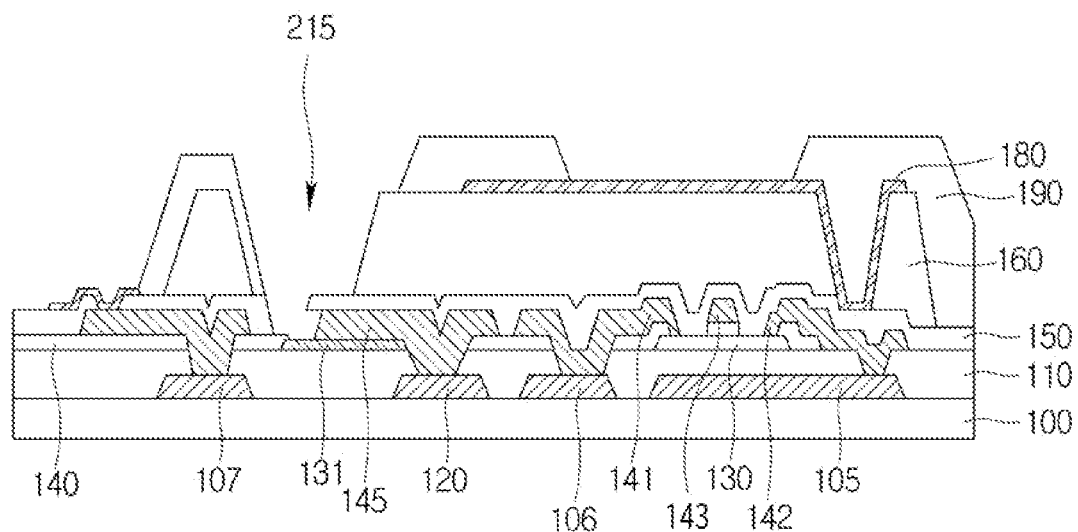

Referring to FIG. 12, a first electrode 180 and a bank insulating film 190 are formed on the overcoat film 160. The first electrode 180 is connected to the drain electrode 142 through a via hole that is formed to pass through the overcoat film 160. The bank insulating film 190 is formed in a manner to exposes a central portion of the first electrode 180. The center portion of first electrode 180, which is not covered by the bank insulating film 190 so as to be exposed, is defined as an emission region.

Figure 13:
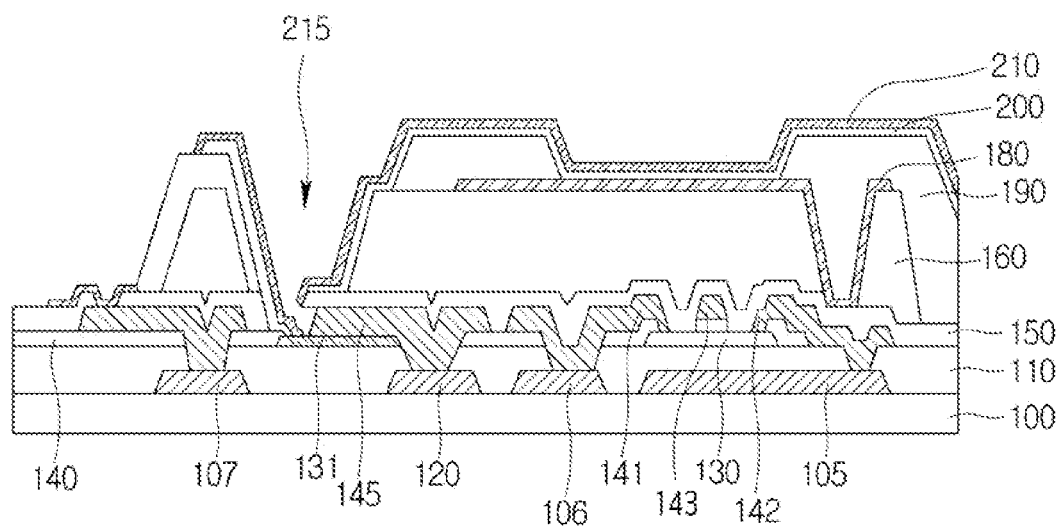

Referring to FIG. 13, an emissive layer 200 and a second electrode 210 are sequentially formed on the first electrode 180 and the bank insulating film 190. The emissive layer 200 is cut apart within the contact hole 215 due to the presence of the undercut structure 170. The second electrode 210 covers one end of the emissive layer 200 and is in direct contact with the active interconnection line 131. In some embodiments, the second electrode 210 extends into the undercut structure 170 to make a contact with the auxiliary interconnection line 145.

Referring to FIG. 4, the second substrate 300 is bonded to the first substrate 100. Fillers (not specifically shown) are injected into a gap the second substrate 300 and the first substrate 100 to maintain adhesion between the first substrate 100 and the second substrate 300. Alternatively, an encapsulation layer is interposed between the second substrate 300 and the first substrate 100 to prevent moisture or foreign matter from permeating. The encapsulation layer may have, for example, a multi-layer structure in which inorganic films and organic films are alternately stacked.

The ordinarily skilled in the art to which the present disclosure pertains will appreciate that the present invention can be implemented in various specific forms without departing from the technical spirit or without changing the essential features. Therefore, it should be understood that the embodiments described above are illustrative in all respects and not restrictive. The scope of the present invention is indicated by the accompanying claims, rather than the detailed description, and all the changed or modified forms derived from the meaning and scope of the claims and their equivalent concepts should be interpreted to fall within in the scope of the present disclosure.

What is claimed is:

1. An organic light-emitting diode (OLED) display device comprising:
    a substrate in which a pixel area and a non-pixel area are defined;
    an auxiliary electrode formed on the substrate;
    a buffer film covering the auxiliary electrode;
    an active interconnection line formed on the buffer film;
    an auxiliary interconnection line that extends through the buffer film and connects an end of the active interconnection line to the auxiliary electrode;
    a first passivation film covering the auxiliary interconnection line and having a contact hole that is formed through the first passivation film and in which an undercut structure is formed such that the active interconnection line is exposed through the undercut structure; and
    a light-emitting element comprising a first electrode, an emissive layer, and a second electrode that are sequentially stacked on the first passivation film within the pixel area,
    wherein the second electrode extends into the non-pixel area so that the second electrode is connected to a portion of the active interconnection line, the portion being exposed through the undercut structure within the through hole,
        wherein the OLED display device further comprising a driving transistor that is formed on the substrate and which drives the light-emitting element,
        wherein the driving transistor comprises a gate electrode and a drain electrode that is electrically connected to the first electrode of the light-emitting element, and
        wherein the gate electrode, the drain electrode, and the auxiliary interconnection line are formed in the same process step.

2. The OLED display device according to claim 1, wherein the second electrode extends along an upper surface of the active interconnection line and reaches a position within the undercut structure, thereby being connected with the auxiliary interconnection line within the undercut structure.

3. The OLED display device according to claim 2, wherein a portion of the first passivation film protrudes from a wall surface of the contact hole and projects out over the active interconnection line within the contact hole such that the first passivation film partially overlaps the active interconnection line when viewed from above, and
    the emissive layer is not formed on an upper surface of a portion of the active interconnection line, the portion overlapping the first passivation film.

4. The OLED display device according to claim 1, further comprising an auxiliary substrate provided with a color filter, the auxiliary substrate being bonded to the substrate by a filler.

5. The OLED display device according to claim 1, wherein an upper end of the undercut structure is defined by a lower surface of the passivation film.

6. The OLED display device according to claim 1, wherein a portion of the first passivation film protrudes from a wall surface of the contact hole and projects out over the active interconnection line within the contact hole such that the first passivation film partially overlaps the active interconnection line when viewed from above, and
    the second electrode extends to cover an upper surface of another portion of the active interconnection line, the another portion overlapping the first passivation film when viewed from above.

7. The OLED display device according to claim 1, further comprising a second passivation film that is formed to fill the undercut structure.

8. A method of manufacturing an organic light-emitting diode (OLED) display device, the method comprising:
    forming an auxiliary electrode on a substrate in which a pixel area and a non-pixel area are defined;
    forming a buffer film to cover the auxiliary electrode;
    forming an active interconnection film on the buffer film;
    forming an auxiliary interconnection line formed to pass through the buffer film and configured to connect at least one of the auxiliary electrode to the active interconnection line;
    forming a passivation film covering the auxiliary interconnection line;
    etching the passivation film within the non-pixel area so that a portion of the auxiliary interconnection line is exposed;
    forming a contact hole by partially etching the exposed auxiliary interconnection line such that an undercut structure occurs within the contact hole; and
    forming a light-emitting element comprising a first electrode, an emissive layer, and a second electrode that are sequentially formed on the passivation film,
    wherein the second electrode extends into the non-pixel area to be connected to the active interconnection line exposed through the undercut structure, wherein the method further comprising forming a driving transistor that drives the light-emitting element on the substrate, wherein the driving transistor comprises a gate electrode and a drain electrode electrically connected to the first electrode, and wherein the gate electrode, the drain electrode and the auxiliary interconnection line are formed in the same process step.

9. The method according to claim 8, wherein the forming of the active interconnection line comprises:

forming an active pattern made of a silicon-based semiconductor or an oxide-based semiconductor on the buffer film; and performing a plasma treatment process or a heat treatment process on the active pattern so that the oxide-based semiconductor becomes conductive.

10. The method according to claim 8, wherein the second electrode extends along an upper surface of the active interconnection line to enter into the undercut structure such that the second electrode is connected to the auxiliary interconnection line.

11. The method according to claim 8, wherein a portion of the passivation film projects out over the active interconnection line within the contact hole such that the passivation film overlaps the active interconnection line when viewed from above, and the second electrode extends along an upper surface of the active interconnection line that overlaps the passivation film when viewed from above.

12. The method according to claim 8, further comprising bonding an auxiliary substrate provided with a color filter to the substrate, the color filter being disposed to the substrate.

* * * * *